(12) United States Patent
Niimi

(10) Patent No.: US 10,407,615 B2
(45) Date of Patent: Sep. 10, 2019

(54) FLUORESCENT MATERIAL, METHOD OF PRODUCING SAME, AND LIGHT EMITTING DEVICE

(71) Applicant: NICHIA CORPORATION, Anan-shi, Tokushima (JP)

(72) Inventor: Tsunehito Niimi, Anan (JP)

(73) Assignee: NICHIA CORPORATION, Anan-shi (JP)

( * ) Notice: Subject to any disclaimer, the term of this patent is extended or adjusted under 35 U.S.C. 154(b) by 0 days.

(21) Appl. No.: 15/819,383

(22) Filed: Nov. 21, 2017

(65) Prior Publication Data

US 2018/0142147 A1 May 24, 2018

(30) Foreign Application Priority Data

Nov. 24, 2016 (JP) ................................. 2016-227863
Nov. 9, 2017 (JP) ................................. 2017-216572

(51) Int. Cl.
*H01L 33/00* (2010.01)
*C09K 11/61* (2006.01)
*H01L 33/50* (2010.01)
*C09K 11/02* (2006.01)

(52) U.S. Cl.
CPC .......... *C09K 11/617* (2013.01); *C09K 11/025* (2013.01); *C09K 11/616* (2013.01); *H01L 33/504* (2013.01); *H01L 2933/0041* (2013.01)

(58) Field of Classification Search
None
See application file for complete search history.

(56) References Cited

U.S. PATENT DOCUMENTS

| | | | |
|---|---|---|---|
| 2010/0164367 A1* | 7/2010 | Shioi ...................... | C04B 35/597 313/503 |
| 2011/0038947 A1 | 2/2011 | Maurer et al. | |
| 2015/0061488 A1 | 3/2015 | Yoshida | |
| 2016/0160122 A1 | 6/2016 | You et al. | |
| 2016/0289553 A1 | 10/2016 | Beers et al. | |
| 2016/0289555 A1* | 10/2016 | Niimi ................. | C09K 11/7731 |
| 2017/0012181 A1 | 1/2017 | Emoto et al. | |

FOREIGN PATENT DOCUMENTS

| | | |
|---|---|---|
| CN | 105038776 A | 11/2015 |
| JP | S59-149981 A | 8/1984 |
| JP | H11-256150 A | 9/1999 |
| JP | 2011012091 A | 1/2011 |
| JP | 2012-224536 A | 11/2012 |
| JP | 2013108016 A | 6/2013 |
| JP | 2014-162913 A | 9/2014 |
| JP | 2017078097 A | 4/2017 |
| WO | 2014141852 A1 | 9/2014 |
| WO | 2015129741 A1 | 9/2015 |
| WO | 2016136066 A1 | 9/2016 |

* cited by examiner

*Primary Examiner* — Calvin Y Choi
(74) *Attorney, Agent, or Firm* — Hunton Andrews Kurth LLP

(57) ABSTRACT

Provided are a fluorescent material with excellent durability, which emits red light, a method of producing the same, and a light emitting device. The fluorescent material is a fluorescent material including a fluoride-containing fluorescent material core comprising Mn, at least one element selected from the group consisting of an alkali metal element and $NH_4^+$, and at least one element selected from the group consisting of a Group 4 element and a Group 14 element in a composition thereof; and at least one of an aluminum hydroxide particle and a calcium hydroxide particle as disposed on a surface of the fluorescent material core.

17 Claims, 7 Drawing Sheets

FLUORESCENT MATERIAL, METHOD OF PRODUCING SAME, AND LIGHT EMITTING DEVICE

CROSS-REFERENCE TO RELATED PATENT APPLICATION

The present application claims priority under 35 U. S. C. § 119 to Japanese Patent Application No. 2016-227863, filed Nov. 24, 2016, and Japanese Patent Application No. 2017-216572, filed on Nov. 9, 2017, the entire disclosures of which are hereby incorporated herein by references in their entirely.

BACKGROUND

Technical Field

The present disclosure relates to a fluorescent material, a method of producing the same, and a light emitting device.

Description of Related Art

Light emitting devices capable of emitting white light through a combination of, a light emitting element that emits blue light as an excitation light source and a fluorescent material that emits red light and a fluorescent material that emits green light, each of which is excited by the light from the excitation light source, are known. Use of such a light emitting device is being allowed to proceed in broad fields including ordinary lightings, in-vehicle lightings, displays, and backlights for liquid-crystal devices.

As a fluorescent material having an excitation band in a blue region and capable of emitting red light with a narrow full width at half maximum of light emission peak, for example, a fluoride fluorescent material having a composition of $K_2SiF_6:Mn^{4+}$ as disclosed in Japanese Unexamined Patent Publication No. 2012-224536 is known.

SUMMARY

However, in the case of configuring a light emitting device using a fluorescent material that emits red light as disclosed in the related art, there is room for improvement in durability of the fluorescent material. In the case of using the light emitting device for a lighting application, higher durability is required.

Then, an object of an embodiment of the present disclosure is to provide a fluorescent material with excellent durability, which emits red light, a method of producing the same, and a light emitting device.

The means for achieving the aforementioned object are described below, and the present disclosure includes the following embodiments.

A first embodiment of the present disclosure is concerned with a fluorescent material including a fluoride-containing fluorescent material core comprising Mn, at least one element selected from the group consisting of an alkali metal element and $NH_4^+$, and at least one element selected from the group consisting of a Group 4 element and a Group 14 element in a composition thereof; and at least one of an aluminum hydroxide particle and a calcium hydroxide particle as disposed on the surface of the fluorescent material core.

A second embodiment of the present disclosure is concerned with a light emitting device including a first fluorescent material containing the aforementioned fluorescent material; and a light emitting element having a light emission peak wavelength in a wavelength range of 380 nm or more and 470 nm or less.

A third embodiment of the present disclosure is concerned with a method for producing a fluorescent material including the steps of:

preparing a fluoride-containing fluorescent material core comprising Mn, at least one element selected from the group consisting of an alkali metal element and $NH_4^+$, and at least one element selected from the group consisting of a Group 4 element and a Group 14 element in a composition thereof;

allowing at least one of an aluminum hydroxide particle and a calcium hydroxide particle to adhere to the fluorescent material core in a dispersion containing the fluorescent material core dispersed in a liquid medium; and separating the fluorescent material containing at least one of the aluminum hydroxide particle and the calcium hydroxide particle adhered to the fluorescent material core from the liquid medium.

According to embodiments of the present disclosure, it is possible to provide a fluorescent material with excellent durability, which emits red light, a method of producing the same, and a light emitting device.

DETAILED DESCRIPTION

Figure 1:
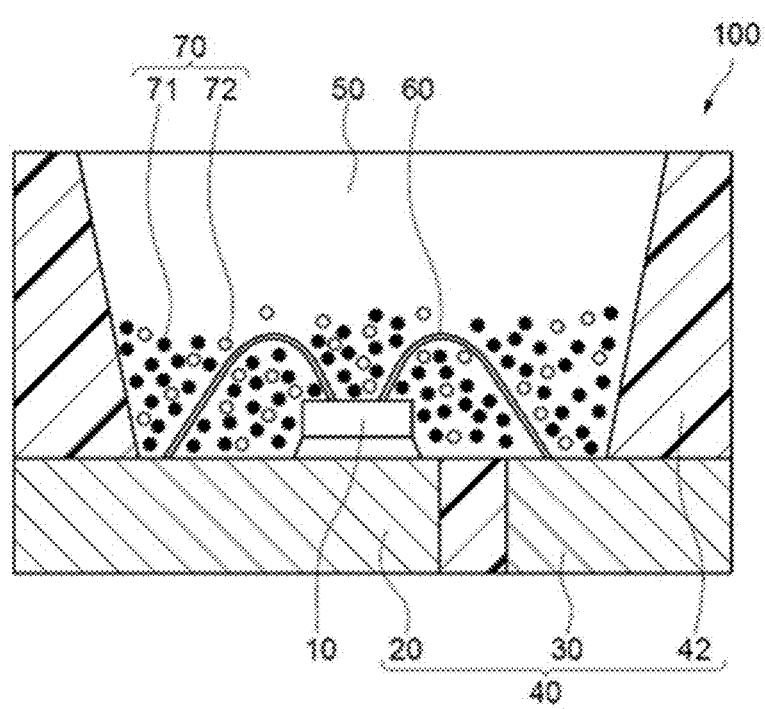
FIG. 1 is a schematic cross-sectional view showing one example of a light emitting device according to the present disclosure.

A fluorescent material, a method for producing the same, and a light emitting device according to the present disclosure are hereunder described. However, the embodiments shown below are concerned with exemplifications for practicing the technical concept of the present invention, and it should be construed that the present invention is by no means limited to the following. In the present specification, the relationship between the color name and the chromaticity coordinate, the relationship between the wavelength range of light and the color name of monochromic light are in accordance with JIS Z8110. The term "step" includes not only an independent step but also a step in which even when not explicitly distinguished from other step, an expected action of the step is achieved. In the case where plural substances corresponding to each component in the composition are present, the content of the respective component in the composition means a total amount of the foregoing plural substances present in the composition unless otherwise specifically indicated.

Fluorescent Material

According to an embodiment of the present disclosure, the fluorescent material includes a fluoride-containing fluorescent material core comprising Mn, at least one element selected from the group consisting of an alkali metal element and $NH_4^+$, and at least one element selected from the group consisting of a Group 4 element and a Group 14 element in a composition thereof; and at least one of an aluminum hydroxide particle and a calcium hydroxide particle as disposed on the surface of the fluorescent material core. The Mn contained in the composition of the fluoride-containing fluorescent material core is preferably $Mn^{4+}$, e.g. in the form of a complex fluoride comprising the Mn as $Mn^{4+}$. The "fluorescent" is synonymous with "fluorescence", and the "fluorescent" means the emission by light irradiation.

Adhesion of the aluminum hydroxide particle and/or the calcium hydroxide particle to the surface of the fluorescent material core may be effected by any of a physical interaction, such as a van der Waals force and an electrostatic interaction, and a chemical interaction, such as a partial chemical reaction. For example, in the case of the chemical interaction, it may be considered that the aluminum hydroxide particle and/or the calcium hydroxide particle is allowed to adhere to the fluorescent material core due to a partial chemical reaction in which an element that constitutes the fluorescent material core and at least one of aluminum and calcium contained in the hydroxide bond to each other via oxygen. The aluminum hydroxide particle and/or the calcium hydroxide particle may be allowed to adhere to the surface of the fluorescent material core in a granular state. The aluminum hydroxide particle and/or the calcium hydroxide particle may be also allowed to adhere to the surface of the fluorescent material core in a state of being contained in a silicon dioxide-containing film-like material as described below. Examples of the aluminum hydroxide particle include an aluminum oxide ($Al(OH)_3$) particle and an aluminum hydroxide oxide ($AlO(OH)$) particle. Examples of the calcium hydroxide particle include a calcium hydroxide ($Ca(OH)_2$) particle.

The related-art light emitting device includes a fluorescent member containing a fluoride-containing fluorescent material particle and a resin, and a plenty of fluorine contained in the fluoride is present on the surface of this fluorescent material particle. Then, it may be considered that adhesiveness between the fluorescent material particle and the resin is worsened due to an influence of fluorine present on the surface of the fluorescent material particle.

In the light emitting device including a fluorescent member with low adhesiveness between the fluorescent material particle and the resin in this way, in the case of allowing a high current to flow through a light emitting element to undergo the light emission, there would be a possibility that if the resin expands, the fluorescent material particle and the resin are separated at an interface therebetween. When the separation is generated at an interface between the fluorescent material particle and the resin, a slight air gap is formed between the fluorescent material particle and the resin. It may be considered that the light is scattered by the slight air gap between the fluorescent material particle and the resin, resulting in a decrease of the incident amount of excited light into the fluorescent material particle and a decrease of the light amount to be taken from the fluorescent material particle to the outside of the light emitting device.

According to an embodiment of the present disclosure, at least one of the aluminum hydroxide particle and the calcium hydroxide particle is allowed to adhere to the surface of the fluoride-containing fluorescent material core having a specified composition. Accordingly, this aluminum hydroxide particle and/or calcium hydroxide particle captures chemically or physically a gas containing fluorine (F) slightly generated from the fluoride, such as a fluorine gas ($F_2$), a hydrogen fluoride gas (HF), and a silicon fluoride gas ($SiF_4$). The fluorine-containing gas slightly generated from the fluorescent material core is captured by the aluminum hydroxide particle and/or the calcium hydroxide particle adhered to the surface of the fluorescent material core, and therefore, degradation of the resin generated by the fluorine-containing gas can be suppressed. Since the degradation of the resin is suppressed, deterioration of the adhesiveness between the fluorescent material and the resin is suppressed. According to an embodiment of the present disclosure, in the fluorescent material, the deterioration of the adhesiveness between the fluorescent material and the resin is suppressed, and therefore, a light emitting device in which changes in the x-value and the y-value in the chromaticity coordinate are small, a change of the chromaticity is suppressed, and excellent durability is exhibited can be configured.

It is preferred that the fluoride contained in the fluorescent material core has a composition represented by the following formula (1). It is preferred that the fluoride contained in the fluorescent material core contains at least potassium (K) and silicon (Si) in a composition thereof.

$$A_2[M_{1-p}Mn^{4+}_pF_6] \quad (1)$$

wherein the formula (1), A is at least one element selected from the group consisting of an alkali metal element and $NH_4^+$; M is at least one element selected from the group consisting of a Group 4 element and a Group 14 element; and p is number satisfying 0<p<0.1.

Details of the fluoride contained in the fluorescent material core are those described already.

According to an embodiment of the present disclosure, it is preferred that the fluorescent material further includes silicon dioxide disposed on the surface of the fluorescent material core. It is preferred that the silicon dioxide is allowed to adhere to the surface of the fluorescent material core. It is preferred that the adhesion of silicon dioxide to the surface of the fluorescent material core is effected by a chemical interaction between an element in the fluorescent material core and silicon (Si) via oxygen (O). The adhesion of silicon dioxide to the surface of the fluorescent material core may also be effected by a physical interaction, such as a van der Waals force and an electrostatic interaction. It is preferred that the silicon dioxide forms a film-like material containing at least one of an aluminum hydroxide particle and a calcium hydroxide particle and adheres to the surface of the fluorescent material core. The aluminum hydroxide particle and/or the calcium hydroxide particle can be more firmly disposed on the surface of the fluorescent material core by the silicon dioxide-containing film-like material, and therefore, separation of such a particle from the fluorescent material core can be prevented from occurring.

A sum total content of aluminum and calcium in the aluminum hydroxide particle and/or the calcium hydroxide particle disposed on the surface of the fluorescent material core is preferably in a range of 0.1% by mass or more and 5.0% by mass or less, more preferably in a range of 0.2% by mass or more and 4.0% by mass or less, and still more preferably in a range of 0.2% by mass or more and 3.0% by mass or less based on 100% by mass of the fluorescent material. When the sum total content of aluminum and calcium in the aluminum hydroxide particle and/or the calcium hydroxide particle disposed on the surface of the fluorescent material core falls within the range of 0.1% by mass or more and 5.0% by mass or less, the fluorescent material suppresses deterioration of light emission properties and has excellent durability. At least one of the aluminum hydroxide particle and the calcium hydroxide particle may be an aluminum hydroxide particle alone, a calcium hydroxide particle alone, or a mixture of an aluminum hydroxide particle and a calcium hydroxide particle.

The content of silicon contained in silicon dioxide disposed on the surface of the fluorescent material core is preferably in a range of 0.1% by mass or more and 10.0% by mass or less, more preferably in a range of 1.0% by mass or more and 8.0% by mass or less, and still more preferably in a range of 1.5% by mass or more and 5.0% by mass or less based on 100% by mass of the fluorescent material. When the content of silicon contained in silicon dioxide disposed on the surface of the fluorescent material core falls within the range of 0.1% by mass or more and 10.0% by mass or less, deterioration of light emission properties of the fluorescent material can be suppressed, and at least one of the aluminum hydroxide particle and the calcium hydroxide particle can be disposed on the surface of the fluorescent material core.

The content ratio of each of aluminum in the aluminum hydroxide particle or calcium in the calcium hydroxide particle disposed on the surface of the fluorescent material core and silicon in silicon dioxide in the fluorescent material as the film-like material can be measured by ICP-AES (high-frequency inductively coupled plasma atomic emission spectroscopy).

The $Mn^{4+}$-activated fluoride-containing fluorescent material core is able to absorb light in a short wavelength region of visible light to emit red light. It is preferred that the exciting light in a short wavelength region of visible light is chiefly light in a blue region. Specifically, in the exciting light, it is preferred that the light emission peak wavelength is present in a wavelength range of 380 nm or more and 485 nm or less, and it is more preferred that the light emission peak wavelength is present in a wavelength range of 380 nm or more and 470 nm or less. When the exciting light is one having a light emission peak wavelength in the aforementioned wavelength range, the light emission efficiency of the fluorescent material can be improved.

In the fluorescent material, it is preferred that the light emission peak wavelength of light emission spectrum is present in a range of 610 nm or more and 650 nm or less. It is preferred that a full width at half maximum of the light emission spectrum of the fluorescent material is narrow, and specifically, it is preferred that the full width at half maximum is 10 nm or less.

In the fluorescent material, a volume average particle diameter thereof is preferably in a range of 1 µm or more and 100 µm or less, more preferably in a range of 2 µm or more and 80 µm or less, and still more preferably in a range of 5 µm or more and 70 µm or less. In the fluorescent material, when the volume average particle diameter falls within the range of 1 µm or more and 100 µm or less, the high light emission intensity can be maintained, and the durability can be improved. In the fluorescent material, when the volume average particle diameter falls within the range of 1 µm or more and 100 µm or less, workability in producing a light emitting device can be improved. The particle size distribution of particles of the fluorescent material is preferably a particle size distribution of a single peak having a peak within the range of 1 µm or more and 100 µm or less, and more preferably a particle size distribution with a narrow distribution width. In the present specification, the volume average particle diameter of the fluorescent material is a particle diameter (median diameter) as measured by a laser diffraction particle size distribution measuring apparatus (MASTER SIZER 2000, manufactured by Malvern Instruments, Ltd.).

Method of Producing Fluorescent Material

According to an embodiment of the present disclosure, the method of producing of a fluorescent material includes the steps of:

preparing a fluoride-containing fluorescent material core comprising Mn, at least one element selected from the group consisting of an alkali metal element and $NH_4^+$, and at least one element selected from the group consisting of a Group 4 element and a Group 14 element in a composition thereof (this step will be hereinafter also referred to as "preparation step");

allowing at least one of an aluminum hydroxide particle and a calcium hydroxide particle to adhere to the fluorescent material core in a dispersion containing the fluorescent material core dispersed in a liquid medium (this step will be hereinafter also referred to as "adhesion step"); and separating the fluorescent material containing at least one of the aluminum hydroxide particle and the calcium hydroxide particle adhered to the fluorescent material core from the liquid medium (this step will be hereinafter also referred to as "separation step").

Preparation Step

In the preparation step, a fluoride-containing fluorescent material core comprises Mn, at least one element selected from the group consisting of an alkali metal element and $NH_4^+$, and at least one element selected from the group consisting of a Group 4 element and a Group 14 element in a composition thereof. The fluorescent material core has a function of absorbing the excited light to emit light even as it is. The fluorescent material core may be suitably selected among commercially available products and prepared, or the fluorescent material core may be prepared by manufacturing a fluorescent material according to an already known method described in, for example, Japanese Unexamined Patent Publication No. 2012-224536.

It is preferred that the fluoride contained in the fluorescent material core contains at least potassium (K) and silicon (Si) in a composition thereof. It is preferred that the fluoride has a composition represented by the following formula (1).

$$A_2[M_{1-p}Mn^{4+}{}_pF_6] \tag{1}$$

wherein the formula (1), A is at least one element selected from the group consisting of an alkali metal element and $NH_4^+$; M is at least one element selected from the group consisting of a Group 4 element and a Group 14 element; and p is number satisfying $0<p<0.1$.

In the formula (1), A is at least one element selected from the group consisting of an alkali metal element and $NH_4^+$; A preferably contains at least K and may further contain at least one element selected from the group consisting of Li, Na, Rb, Cs, and $NH_4^+$; and A is more preferably an alkali metal element composed mainly of K. The terms "composed mainly of K" as referred to herein means that the content of K in A in the formula (1) is 80 mol % or more, and the content of K is preferably 90 mol % or more, and more preferably 95 mol % or more.

In the formula (1), M is at least one element selected from the group consisting of a Group 4 element and a Group 14 element and preferably is at least one element selected from the group consisting of titanium (Ti), zirconium (Zr), hafnium (Hf), silicon (Si), germanium (Ge), and tin (Sn). It is more preferred that M in the formula (1) contains silicon (Si), or silicon (Si) and germanium (Ge). It is still more preferred that M in the formula (1) is silicon (Si), or silicon (Si) and germanium (Ge).

In the formula (1), in the case where M contains silicon (Si), or silicon (Si) and germanium (Ge), a part of at least one of Si and Ge may be substituted with at least one element selected from the group consisting of a Group 4 element including Ti, Zr, and Hf, and a Group 14 element including C and Sn. In that case, a total content of Si and Ge in M in the formula (1) is, for example, preferably 90 mol % or more, and more preferably 95 mol % or more.

In the formula (1), from the viewpoints of light emission efficiency and light emission intensity, parameter p preferably satisfies $0<p<0.1$, more preferably satisfies $0.01 \leq p<0.09$, and still more preferably satisfies $0.02 \leq p \leq 0.08$.

Adhesion Step

In the adhesion step, at least one of an aluminum hydroxide particle and a calcium hydroxide particle is allowed to adhere to the prepared fluorescent material core in a dispersion containing the fluorescent material core dispersed in a liquid medium.

It is preferred to include a step of adding a silicon compound and a basic solution to a dispersion containing the fluorescent material core dispersed therein, thereby allowing a film-like material containing at least one of an aluminum hydroxide particle and a calcium hydroxide particle and silicon dioxide to adhere to the aforementioned fluorescent material core. The aluminum hydroxide particle and/or the calcium hydroxide particle can be more firmly disposed on the surface of the fluorescent material core by the silicon dioxide-containing film-like material, and therefore, separation of such a particle from the fluorescent material core can be prevented.

It is preferred to include a step of adding an aluminum salt and a basic solution to a dispersion containing the fluorescent material core dispersed therein, thereby allowing an aluminum hydroxide particle to adhere to the fluorescent material core. According to this, as compared with other methods in which a fluorescent material core is further added to a solution containing an aluminum hydroxide particle formed by adding an aluminum salt and a basic solution, it may be considered that the aluminum hydroxide particle can uniformly adhere to the fluorescent material core.

It is preferred to include a step of adding a silicon compound, an aluminum salt, and a basic solution to a dispersion containing the fluorescent material core dispersed therein, thereby allowing an aluminum hydroxide particle and a silicon dioxide-containing film-like material to adhere to the fluorescent material core. According to this, as compared with other methods in which after allowing an aluminum hydroxide particle to adhere to a fluorescent material core, the resultant is taken out from the dispersion, and a silicon dioxide-containing film-like material is allowed to further adhere thereto in another step, the number of steps from the adhesion step is decreased, and therefore, workability can be improved. It is able to prevent separation of the adhered aluminum hydroxide particle from the fluorescent material core on the way of the work as compared with the aforementioned other method.

It is preferred to include a step of adding a silicon compound, a calcium salt, and a basic solution to a dispersion containing the fluorescent material core dispersed therein, thereby allowing a calcium hydroxide particle and a silicon dioxide-containing film-like material to adhere to the fluorescent material core. Examples of the calcium salt include calcium hydroxide ($Ca(OH)_2$). According to this, as compared with other methods in which after allowing a calcium hydroxide particle to adhere to a fluorescent material core, the resultant is taken out from the dispersion, and a silicon dioxide-containing film-like material is allowed to further adhere thereto in another step, the number of steps from the adhesion step is decreased, and therefore, workability can be improved. It is able to prevent separation of the adhered calcium hydroxide particle from the fluorescent material core on the way of the work as compared with the aforementioned other method.

The liquid medium can be suitably selected among generally used liquids. Specifically, organic solvents, such as alcohol-based solvents, e.g., methanol, ethanol or isopropyl alcohol, ketone-based solvents, e.g., acetone or methyl ethyl ketone, and ether-based solvents, e.g., diethyl ether or diisopropyl ether, and water can be used. As the liquid medium, it is preferred to use an alcohol-based solvent that is easy to dissolve the aluminum salt therein and is readily usable as a common solvent even in the case of using a silicon compound as described later. In the case of adding a silicon compound to the dispersion, in order to promote hydrolysis reaction and condensation reaction of the silicon compound, it is preferred to contain water.

A mass ratio of the liquid medium to the fluorescent material core is preferably in a range of 100 parts by mass or more and 1,000 parts by mass or less, more preferably in a range of 100 parts by mass or more and 800 parts by mass or less, and still more preferably in a range of 150 parts by mass or more and 500 parts by mass or less based on 100 parts by mass of the fluorescent material core. When the mass ratio of the liquid medium to the fluorescent material core falls within the range of 100 parts by mass or more and 1,000 parts by mass or less, the fluorescent material core can be approximately uniformly dispersed in the liquid medium, and it becomes possible to allow the aluminum hydroxide particle and/or the calcium hydroxide particle to substantially uniformly adhere to the surface of the fluorescent material core.

The aluminum salt to be added to the dispersion is preferably at least one selected from the group consisting of aluminum chloride, aluminum sulfate, and aluminum nitrate. It is preferred that the aluminum salt is dissolved in pure water and added as an aluminum salt aqueous solution to the dispersion.

The aluminum salt and the basic solution quickly react with each other in the dispersion to produce an aluminum hydroxide particle, and the aluminum hydroxide particle is allowed to approximately uniformly adhere to the surface of the fluorescent material core in the dispersion.

In the aluminum salt to be added to the dispersion, the amount of aluminum in the aluminum salt is preferably in a range of 0.1 parts by mass or more and 10.0 parts by mass or less, more preferably in a range of 0.2 parts by mass or more and 8.0 parts by mass or less, and still more preferably in a range of 0.3 parts by mass or more and 7.0 parts by mass or less based on 100 parts by mass of the fluorescent material core to be dispersed in the liquid medium. When the amount of the aluminum salt to be added to the dispersion falls within the range of 0.1 parts by mass or more and 10.0 parts by mass or less, the aluminum hydroxide particle can adhere to the fluorescent material core without hindering the light emission properties of the fluorescent material.

The basic solution to be added to the dispersion is preferably at least one selected from the group consisting of an ammonia aqueous solution, a sodium hydroxide aqueous solution, a potassium hydroxide aqueous solution, a sodium carbonate aqueous solution, and a potassium carbonate aqueous solution. The aluminum hydroxide particle can be allowed to easily adhere to the fluorescent material core by using a general basic aqueous solution which is readily prepared for the basic solution, The amount of the basic compound in the basic solution has only to be an amount at which the aluminum hydroxide particle is produced through a chemical reaction with the aluminum salt added to the dispersion. The amount of the basic compound in the basic solution is preferably 0.1 parts by mass or more, more preferably 0.5 parts by mass or more, and still more preferably 1.0 part by mass or more, and preferably 10.0 parts by mass or less, more preferably 9.0 parts by mass or less, and still more preferably 8.0 parts by mass or less based on 100 parts by mass of the fluorescent material core to be dispersed in the dispersion.

The silicon compound to be added to the dispersion is preferably a silicon compound capable of forming a film-like material of a silicon dioxide-containing compound or a gel-like compound thereof through hydrolysis reaction and condensation reaction. Examples of the silicon compound include an alkoxy silicon compound that is utilized by the sol-gel method and a partial hydrolysate of such an alkoxy silicon compound. Specifically, the silicon compound is preferably at least one selected from the group consisting of tetramethoxysilane, tetraethoxysilane, methyltrimethoxysilane, methyltriethoxysilane, ethyltrimethoxysilane, and ethyltriethoxysilane.

At least one of the calcium hydroxide particle and the aluminum hydroxide particle and the silicon dioxide-containing film-like material can be allowed to adhere to the fluorescent material core by adding the silicon compound, the calcium salt and/or the aluminum salt, and the basic solution in the dispersion containing the fluorescent material core dispersed therein, specifically by the sol-gel method.

At least one of the aluminum hydroxide particle and the calcium hydroxide particle and the silicon dioxide-containing film-like material may be disposed on at least a part of the surface of the fluorescent material core and allowed to adhere to the fluorescent material core. At least one of the aluminum hydroxide particle and the calcium hydroxide particle and the silicon dioxide-containing film-like material are disposed on the surface of the fluorescent material core in a proportion of preferably 50% or more, and more preferably 70% or more. At least one of the aluminum hydroxide particle and the calcium hydroxide particle and the silicon dioxide-containing film-like material may also be interspersed and disposed on the surface of the fluorescent material core. For example, in a SEM microphotograph of the fluorescent material core, the film-like material is preferably arranged at about half or more (50% or more) of the surface of the fluorescent material core based on the fluorescent material core as 100%, and the film-like material is more preferably arranged at about 70% or more of the fluorescent material core.

The amount by mass of the silicon compound to be added to the dispersion has only to be an amount by mass at which the film-like material is formed on the surface of the fluorescent material core through hydrolysis reaction and condensation reaction in the dispersion. The amount by mass of the silicon compound to be added to the dispersion is preferably 5 parts by mass or more, more preferably 10 parts by mass or more, and still more preferably 15 parts by mass or more, and preferably 30 parts by mass or less, more preferably 25 parts by mass or less, and still more preferably 20 parts by mass or less based on 100 parts by mass of the fluorescent material core to be dispersed in the dispersion. In order to promote the hydrolysis reaction of the silicon compound, it is preferred that water is present in an amount corresponding to a half of the amount by mass of the silicon compound or less and the amount by mass of the silicon compound in the dispersion or more. When the amount of the silicon compound to be added to the dispersion falls within the aforementioned range, at least one of the aluminum hydroxide particle and the calcium hydroxide particle and the silicon dioxide-containing film-like material can be allowed to adhere to the fluorescent material core without hindering the light emission properties of the fluorescent material.

The amount of the calcium salt to be added to the dispersion is preferably in a range of 1.0 part by mass or more and 15.0 parts by mass or less, more preferably in a range of 2.0 parts by mass or more and 12.0 parts by mass or less, and still more preferably in a range of 3.0 parts by mass or more and 10.0 parts by mass or less based on 100 parts by mass of the fluorescent material core to be dispersed in the dispersion. When the amount of the calcium salt to be added to the dispersion falls within the range of 1.0 part by mass or more and 15.0 parts by mass or less, the calcium hydroxide particle can be allowed to adhere to the fluorescent material core without hindering the light emission properties of the fluorescent material.

Separation Step

In the separation step, the fluorescent material containing at least one of the aluminum hydroxide particle and the calcium hydroxide particle adhered to the fluorescent material core is separated from the liquid medium. The separation can be performed by a solid-liquid separation means, such as filtration and centrifugation. The fluorescent material obtained by means of solid-liquid separation may be subjected to washing treatment, drying treatment, as the need arises. The washing treatment can be, for example, performed using an alcohol, such as ethanol and isopropyl alcohol, a ketone solvent, such as acetone, or water. The drying treatment may be performed at room temperature, or may be performed upon heating. In the case of heating by the drying treatment, the drying temperature can be, for example, set to 95° C. to 115° C. A drying time can be, for example, set to 8 hours to 20 hours.

Light Emitting Device

According to an embodiment of the present disclosure, the light emitting device includes a first fluorescent material containing the fluorescent material according to an embodiment of the present disclosure; and a light emitting element having a light emission peak wavelength in a wavelength range of 380 nm or more and 470 nm or less. The aforementioned light emitting device includes a fluorescent member containing the aforementioned first fluorescent material and resin and the aforementioned light emitting element.

It is preferred that the light emitting device further includes a second fluorescent material having a light emission peak wavelength in a wavelength range of 500 nm or more and 580 nm or less. It is preferred that the second fluorescent material is included in the fluorescent member together with the aforementioned first fluorescent material and resin.

One example of the light emitting device is described in detail on a basis of a drawing. FIG. 1 is a schematic cross-sectional view showing an example of the light emitting device 100.

The light emitting device 100 includes a package 40 having a concave part, a light emitting element 10, and a fluorescent member 50 covering the light emitting element 10. The package 40 is integrally composed of a pair of positive and negative lead electrodes 20, 30 and a resin part 42 containing a thermoplastic resin or a thermosetting resin. The light emitting element 10 is disposed within the concave part formed in the package 40 and electrically connected with the pair of positive and negative lead electrodes 20, 30 by an electroconductive wire 60. The fluorescent member 50 is formed by filling within the concave part a sealing resin containing a fluorescent material 70 and covers the light emitting element 10. The fluorescent member 50 includes, for example, the sealing resin and the fluorescent material 70 that undergoes wavelength conversion of light from the light emitting element 10. Furthermore, the fluorescent material 70 includes a first fluorescent material 71 including the fluorescent material of the present embodiment and a second fluorescent material 72 including a fluorescent material other than the fluorescent material of the present embodiment. A part of the pair of positive and negative lead electrodes 20, 30 is exposed to the outside of the package 40. The light emitting device 100 receives supply of power from the outside via these lead electrodes 20, 30 and emits light.

Fluorescent Member

The fluorescent material 70 configures the fluorescent member 50 that covers the light emitting element 10 together with the sealing resin. Examples of the sealing resin include a silicone resin and an epoxy resin. The fluorescent member 50 functions not only a wavelength converting member including the fluorescent material 70 but also a member for protecting the light emitting element 10 and the fluorescent material 70 from the external environment.

The fluorescent member 50 may further include a filler, a light diffusing material, and so on in addition to the sealing resin and the fluorescent material 70. For example, when the light diffusing material is included, directivity from the light emitting element 10 can be relieved, thereby increasing a viewing angle. The filler may also be one acting as the light diffusing material. Examples of the filler may include silica, titanium oxide, zinc oxide, zirconium oxide, and alumina. In the case where the fluorescent member 50 includes the filler, the content of the filler can be, for example, set to a range of 1 part by mass or more and 20 parts by mass or less based on 100 parts by mass of the resin.

Light Emitting Element

The light emitting element 10 emits light having a light emission spectrum on the short wavelength side of visible light (for example, a range of 380 nm or more and 485 nm or less) and has a light emission peak wavelength in a wavelength range of 380 nm or more and 470 nm or less. It is more preferred that the light emission peak wavelength of the light emitting element 10 is present within a wavelength range of 440 nm or more and 460 nm or less. When the light emitting element having a light emission peak wavelength in this wavelength range is used as an excitation light source, a light emitting device that emits a color mixture light of light from the light emitting element and fluorescence from the first fluorescent material and the second fluorescent material can be obtained.

As for the light emitting element, it is preferred to use a semiconductor light emitting element using a gallium nitride-based semiconductor ($In_XAl_YGa_{1-X-Y}N$, $0 \leq X$, $0 \leq Y$, $X+Y \leq 1$). When the semiconductor light emitting element is used, a stable light emitting device which is high in linearity of an output against an input with high efficiency and strong against a mechanical impact can be obtained. A full width at half maximum of light emission spectrum of the light emitting element can be, for example, set to 30 nm or less.

First Fluorescent Material and Second Fluorescent Material

The fluorescent material 70 absorbs at least a part of the light emitted from the light emitting element 10 and converts it into a wavelength different from the wavelength of the light emitted from the light emitting element 10. As for the fluorescent material 70, it is preferred to use the first fluorescent material 71 including the fluorescent material of an embodiment of the present disclosure and the second fluorescent material 72 having a light emission peak wavelength in a wavelength range different from the first fluorescent material 71.

Examples of the second fluorescent material 72 may include $(Y,Gd,Tb,Lu)_3(Al,Ga)_5O_{12}:Ce$, $Ca_3Sc_2Si_3O_{12}:Ce$, $CaSc_2O_4:Ce$, $(Ca,Sr,Ba)_2SiO_4:Eu$, $(Ca,Sr,Ba)_8MgSi_4O_{16}(F,Cl,Br)_2:Eu$, $Si_{6-z}Al_zO_zN_{8-z}:Eu$ ($0<z\leq4.2$), $(Ba,Sr)MgAl_{10}O_{17}:Mn$, $(Sr,Ba,Ca)Ga_2S_4:Eu$, $(La,Y)_3Si_6N_{11}:Ce$, $(Ca,Sr,Ba)_3Si_6O_9N_4:Eu$, $(Ca,Sr,Ba)_3Si_6O_{12}N_2:Eu$, $(Ba,Sr,Ca)Si_2O_2N_2:Eu$, $(Sr,Ca)LiAl_3N_4:Eu$, $(Ca,Sr,Ba)_2Si_5N_8:Eu$, $(Ca,Sr)AlSiN_3:Eu$, $(Ca,Sr,Ba)S:Eu$, and $3.5MgO.0.5MgF_2.GeO_2:Mn$. Among those, examples of the second fluorescent material having a light emission peak wavelength in a wavelength range of 500 nm or more and 580 nm or less may include $(Y,Gd,Tb,Lu)_3(Al,Ga)_5O_{12}:Ce$, $(Ca,Sr,Ba)_8MgSi_4O_{16}(F,Cl,Br)_2:Eu$, $Si_{6-z}Al_zO_zN_{8-z}:Eu$ ($0<z\leq4.2$), and $(Ba,Sr)MgAl_{10}O_{17}:Mn$.

As for the second fluorescent material 72, from the viewpoint of light emission efficiency, a volume average particle diameter thereof is preferably in a range of 2.0 µm or more and 50.0 µm or less, more preferably in a range of 5.0 µm or more and 45.0 µm or less, and still more preferably in a range of 10.0 µm or more and 40.0 µm or less.

EXAMPLES

The present invention will now be described in detail with reference to examples, but the present invention is not limited to these examples.

Production of Fluorescent Material Core 16.25 g of $K_2MnF_6$ was weighed and dissolved in 1,000 g of a 55% by mass HF aqueous solution to prepare a solution A. In addition, 195.10 g of $KHF_2$ was weighed and dissolved in 200 g of a 55% by mass HF aqueous solution to prepare a solution B. 450 g of a 40% by mass $H_2SiF_6$ aqueous solution was weighed to prepare a solution C.

Subsequently, the solution B and the solution C were added to solution A, respectively over about 20 minutes while stirring the solution A at room temperature. After subjecting the obtained precipitate to solid-liquid separation, the resultant was washed with IPA (isopropyl alcohol) and dried at 70° C. for 10 hours to produce a granular fluorescent material core containing a fluoride having a composition represented by $K_2[Si_{0.962}Mn^{4+}_{0.038}F_6]$.

Example 1

50 g of the fluorescent material core was added to and dispersed in 90 g of ethanol (purity: 99.5% or more) that is a liquid medium, thereby obtaining a dispersion. The dispersion became a slurry containing the granular fluorescent material core. To the dispersion, 3.9 g of an aluminum chloride aqueous solution (aluminum concentration: 12.7% by mass) prepared by adding aluminum chloride to pure water and 10.7 g of ammonia water (ammonium concentration: 18.0% by mass) as a basic solution were added. The dispersion to which the aluminum chloride aqueous solution and the ammonia water had been added was thoroughly stirred. The dispersion was filtered, and the fluorescent material was separated from the slurry was dehydrated, followed by drying to obtain a granular fluorescent material. In the fluorescent material of Example 1, an aluminum hydroxide particle was allowed to adhere to the surface of the granular fluorescent material core.

Example 2

A granular fluorescent material was obtained in the same manner as in Example 1, except for adding 11.8 g of the aluminum chloride aqueous solution (aluminum concentration: 12.7% by mass) to the dispersion. In the fluorescent material of Example 2, an aluminum hydroxide particle was allowed to adhere to the surface of the granular fluorescent material core.

Example 3

A granular fluorescent material was obtained in the same manner as in Example 1, except for adding 19.7 g of the aluminum chloride aqueous solution (aluminum concentration: 12.7% by mass) to the dispersion. In the fluorescent material of Example 3, an aluminum hydroxide particle was allowed to adhere to the surface of the granular fluorescent material core.

Example 4

50 g of the fluorescent material core was added to and dispersed in 90 g of ethanol (purity: 99.5% or more) that is a liquid medium, thereby obtaining a dispersion. The dispersion became a slurry containing the granular fluorescent material core. To the dispersion, 8.9 g of tetraethoxysilane $(Si(OC_2H_5)_4)$, 8.9 g of pure water, 3.9 g of an aluminum chloride aqueous solution (aluminum concentration: 12.7% by mass), and 10.7 g of ammonia water (ammonium concentration: 18.0% by mass) as a basic solution were added. The dispersion was thoroughly stirred, thereby subjecting the tetraethoxysilane to hydrolysis reaction and condensation reaction. The dispersion was filtered, and the fluorescent material was separated from the slurry was dehydrated, followed by drying to obtain a granular fluorescent material. In the fluorescent material of Example 4, an aluminum hydroxide particle and a silicon dioxide-containing film-like material were allowed to adhere to the surface of the granular fluorescent material core.

Example 5

A granular fluorescent material was obtained in the same manner as in Example 4, except for adding 11.8 g of the aluminum chloride aqueous solution (aluminum concentration: 12.7% by mass) to the dispersion. In the fluorescent material of Example 5, an aluminum hydroxide particle and a silicon dioxide-containing film-like material were allowed to adhere to the surface of the granular fluorescent material core.

Example 6

A granular fluorescent material was obtained in the same manner as in Example 4, except for adding 19.7 g of the aluminum chloride aqueous solution (aluminum concentration: 12.7% by mass) to the dispersion. In the fluorescent material of Example 6, an aluminum hydroxide particle and a silicon dioxide-containing film-like material were allowed to adhere to the surface of the granular fluorescent material core.

Example 7

50 g of the fluorescent material core was added to and dispersed in 90 g of ethanol (purity: 99.5% or more) that is a liquid medium, together with 2.8 g of a calcium hydroxide powder, thereby obtaining a dispersion. The dispersion became a slurry containing the fluorescent material core. To the dispersion, 8.9 g of tetraethoxysilane $(Si(OC_2H_5)_4$, 8.9 g of pure water, and 10.7 g of ammonia water (ammonium concentration: 18.0% by mass) as a basic solution were added. The dispersion was thoroughly stirred, thereby subjecting the tetraethoxysilane to hydrolysis reaction and condensation reaction. The dispersion was filtered, and the fluorescent material was separated from the slurry was dehydrated, followed by drying to obtain a granular fluorescent material. In the fluorescent material of Example 7, a calcium hydroxide particle and a silicon dioxide-containing film-like material were allowed to adhere to the surface of the granular fluorescent material core.

Comparative Example 1

The fluorescent material core was designated as a granular fluorescent material of Comparative Example 1.
Production of Light Emitting Device
Each of the above-obtained fluorescent materials was designated as the first fluorescent material. A fluorescent material having a composition represented by $Y_3Al_5O_{12}:Ce$ was designated as the second fluorescent material.

The first fluorescent material and the second fluorescent material, a mass ratio of which had been adjusted such that the chromaticity coordinate of light emitted by a light emitting device was located in the vicinity of x=0.380 and y=0.380, were added to a silicone resin, and after mixing and dispersing, the resultant was further defoamed to obtain a fluorescent material-containing resin composition. Subsequently, this fluorescent material-containing resin composition was injected on and filled in a light emitting element of an LED package (light emission peak wavelength of the light emitting element: 455 nm), and further heated at 150° C. for 4 hours to cure the resin composition, thereby preparing a fluorescent material member. Light emitting devices including each of the first fluorescent materials were produced, respectively through the foregoing steps.

The respective fluorescent materials were subjected to the following measurements.
Composition Analysis
With respect to the fluorescent material core, the fluorescent materials of Examples 1 to 7, and the fluorescent material of Comparative Example 1, quantitative analysis of each element was performed using an inductively coupled plasma atomic emission spectrometer (manufactured by Perkin Elmer Inc.) by means of ICP-AES (high-frequency inductively coupled plasma atomic emission spectroscopy). With respect to Al and Ca, the measured quantities of Al and/or Ca measured relative to the fluorescent material were determined as the contents (% by mass) of Al and/or Ca in the aluminum hydroxide particle and/or the calcium hydroxide particle disposed on the surface of the fluorescent material core. The content (% by mass) of K and the content (% by mass) of Si of the fluorescent material core, and the content (% by mass) of K and the content (% by mass) of Si of the fluorescent material were similarly measured. The content of Si contained in the fluorescent material core was subtracted from the content (% by mass) of Si of the fluorescent material, and the content (% by mass) of Si corresponding to a difference thereof was defined as the content (% by mass) of silicon in the silicon dioxide disposed on the surface of the fluorescent material core. In Table 1 showing the results, each of the contents of Al in the aluminum hydroxide particle, Ca in the calcium hydroxide particle, and Si in the silicon dioxide is expressed as the content (% by mass) of each of the elements in the fluorescent material.

Figure 2:
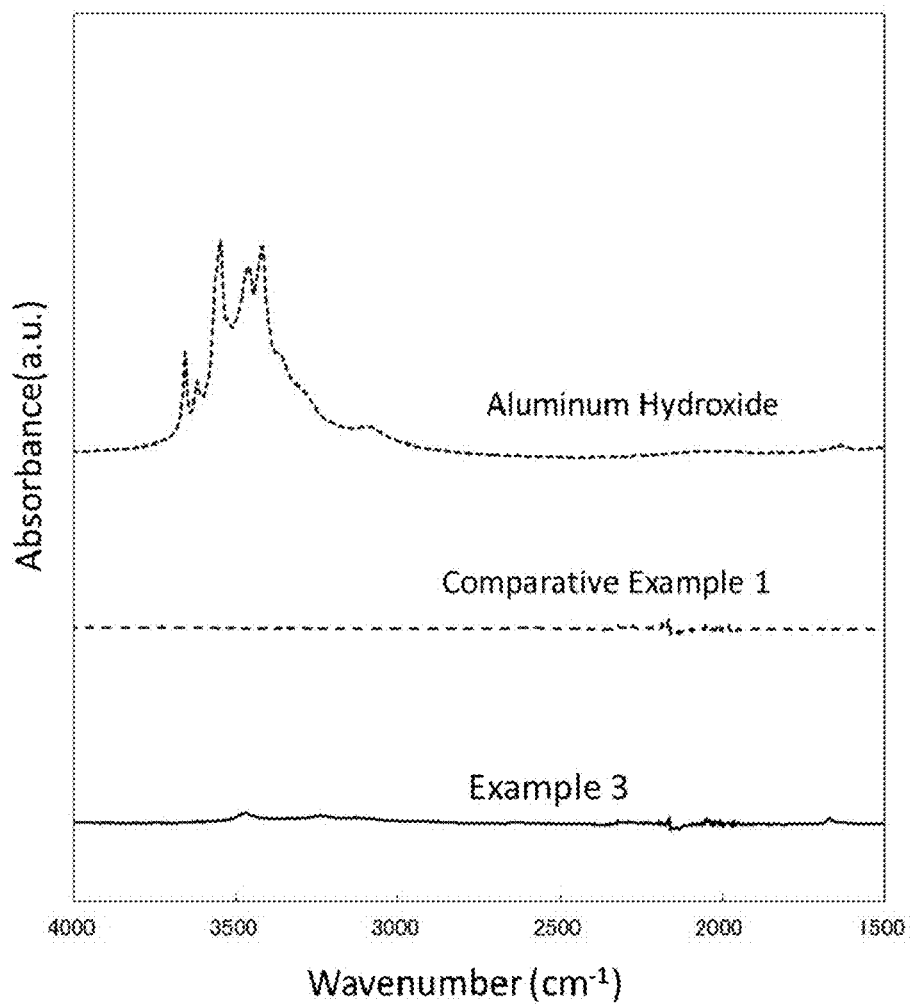
FIG. 2 shows infrared absorption spectra of aluminum hydroxide, a fluorescent material of Comparative Example 1, and a fluorescent material of Example 3 in order from the upper portion, as measured by a Fourier transform infrared spectrometer.

Infrared Absorption Spectrum as Measured by Fourier Transform Infrared Spectrometer With respect to each of the aluminum hydroxide, the fluorescent material of Example 3, and the fluorescent material of Comparative Example 1, an infrared absorption spectrum was measured using a Fourier transform infrared spectrometer (a product name: Nicolet iS50, manufactured by Thermo Fisher Scientific Inc.; hereinafter also referred to as "FT-IR") by means of an attenuated total reflection method (ATR method). The results are shown in FIG. 2.

SEM Image

Figure 3A:
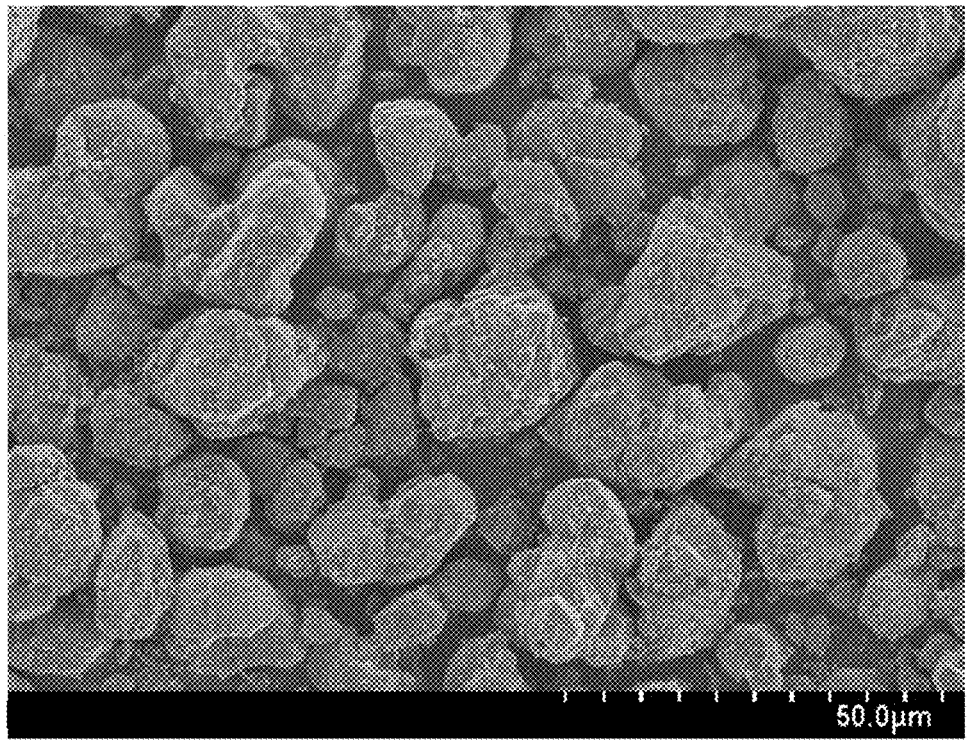
FIG. 3A is a SEM micrograph of a fluorescent material of Example 1.
Figure 3B:
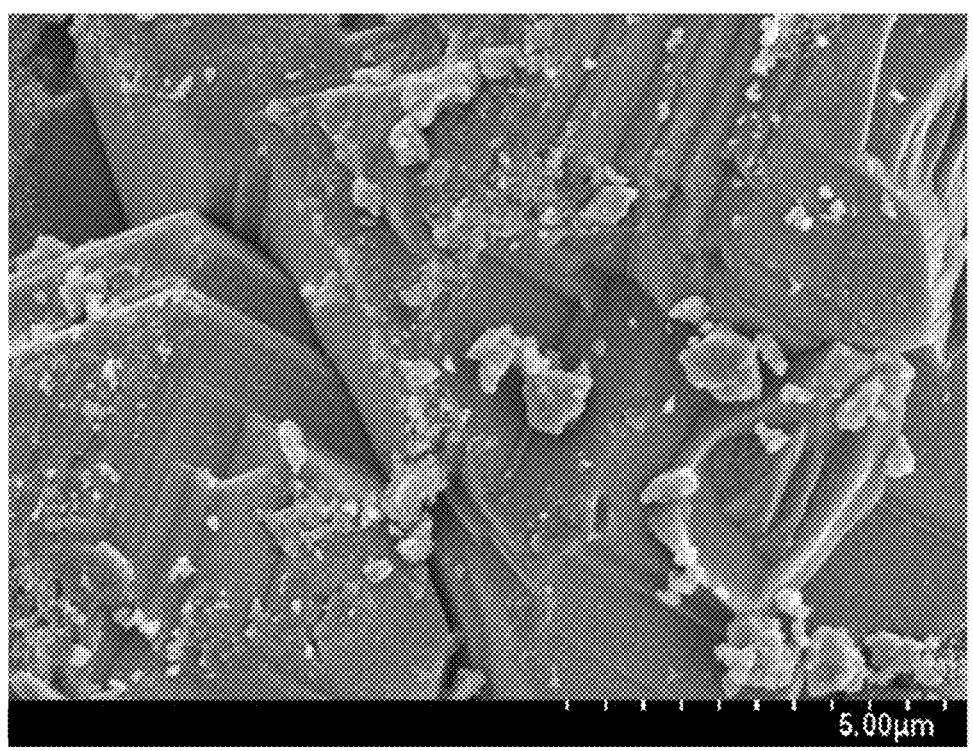
FIG. 3B is a SEM micrograph of a partial enlarged view of a fluorescent material of Example 1.
Figure 4A:
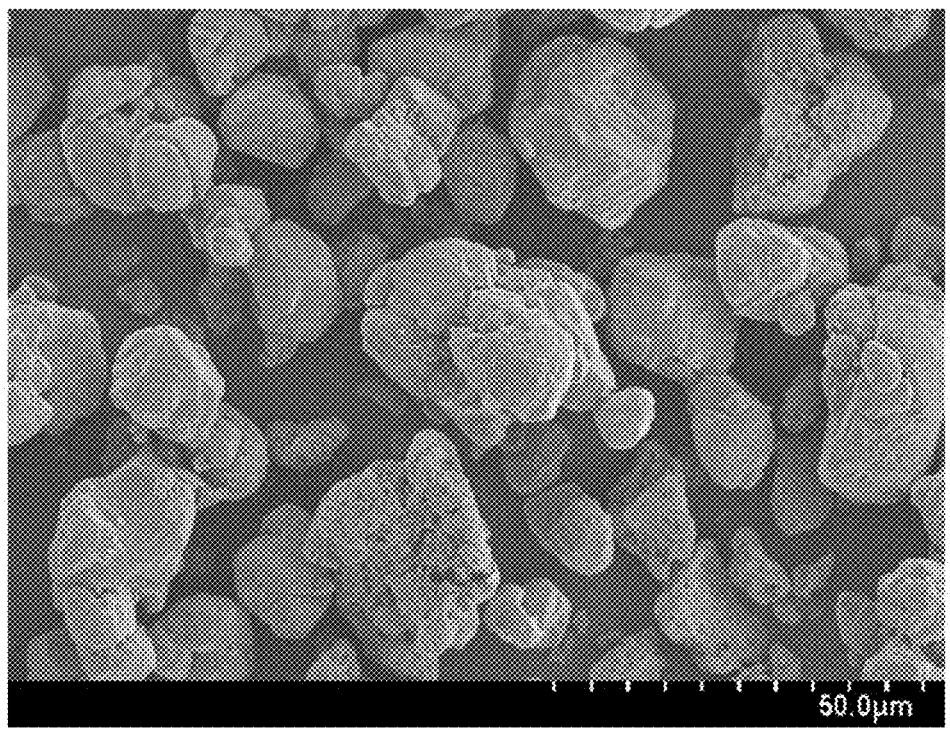
FIG. 4A is a SEM micrograph of a fluorescent material of Example 4.
Figure 4B:
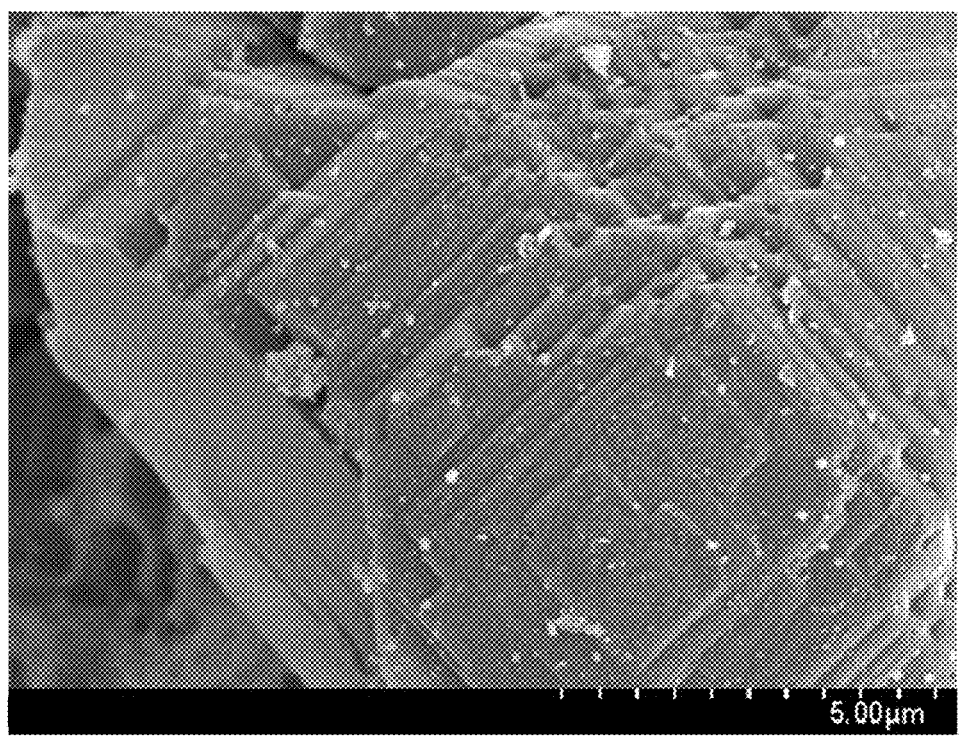
FIG. 4B is a SEM micrograph of a partial enlarged view of a fluorescent material of Example 4.
Figure 5A:
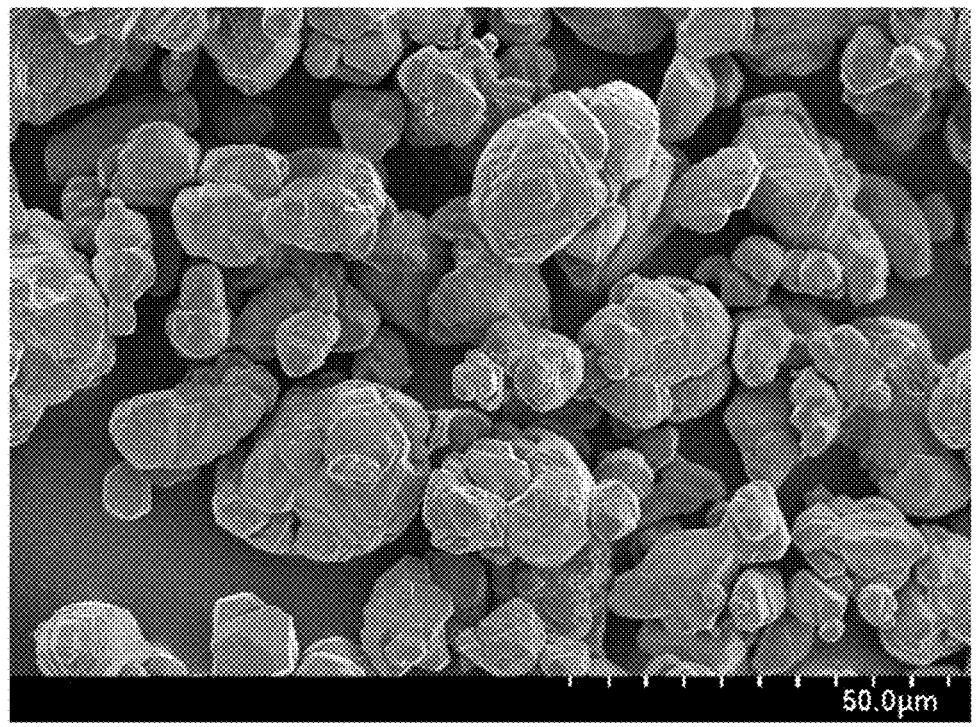
FIG. 5A is a SEM micrograph of a fluorescent material of Comparative Example 1.
Figure 5B:
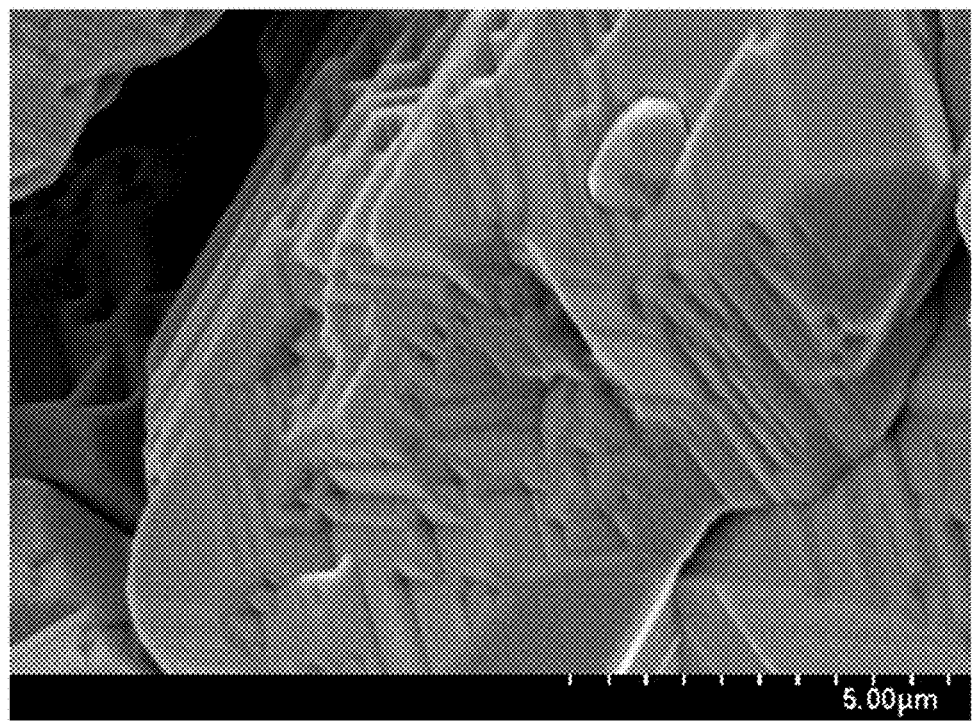
FIG. 5B is a SEM micrograph of a partial enlarged view of a fluorescent material of Comparative Example 1.

Using a scanning electron microscope (SEM), SEM images of the fluorescent materials of Example 1, Example 4, and Comparative Example 1 were taken. FIG. 3A is a SEM micrograph showing the fluorescent material of Example 1, and FIG. 3B is a SEM micrograph showing a partial enlarged view of the fluorescent material of Example 1. FIG. 4A is a SEM micrograph showing the fluorescent material of Example 4, and FIG. 4B is a SEM micrograph showing a partial enlarged view of the fluorescent material of Example 4. FIG. 5A is a SEM micrograph showing the fluorescent material of Comparative Example 1, and FIG. 5B is a SEM micrograph showing a partial enlarged view of the fluorescent material of Comparative Example 1.

Each of the light emitting devices was subjected to the following measurements.

Durability Evaluation

The obtained light emitting device was subjected to a durability test by undergoing continuous lighting at a current of 250 mA in an environmental testing machine at a high temperature of 85° C. and elapsing for 700 hours. An x-value and a y-value in the chromaticity coordinate of the light emitting device before the durability test were defined as initial values, and absolute values of differences of the x-value and the y-value of the light emitting device after the durability test from the initial values were defined as $\Delta x$ and $\Delta y$, respectively. In addition, an initial value of a luminous flux of the light emitting device using the fluorescent material of Comparative Example 1 as the first fluorescent material was defined as 100, and a relative luminous flux (Pi) of an initial value of each of the light emitting devices was measured. A luminous flux of each of the light emitting devices before the durability test was defined as 100, and a luminous flux (Po) of each of the light emitting devices after the durability test was measured. The results are shown in Table 1.

Photograph of Exterior

Figure 6A:
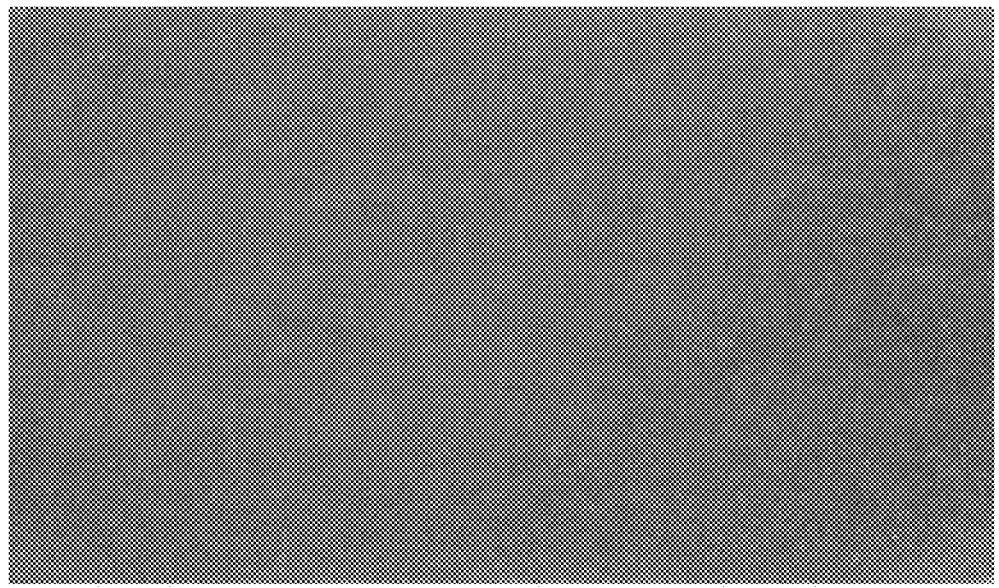
FIG. 6A is a photograph of appearance showing a part of an upper surface of a fluorescent member of a light emitting device using a fluorescent material of Example 4 before a durability test.
Figure 6B:
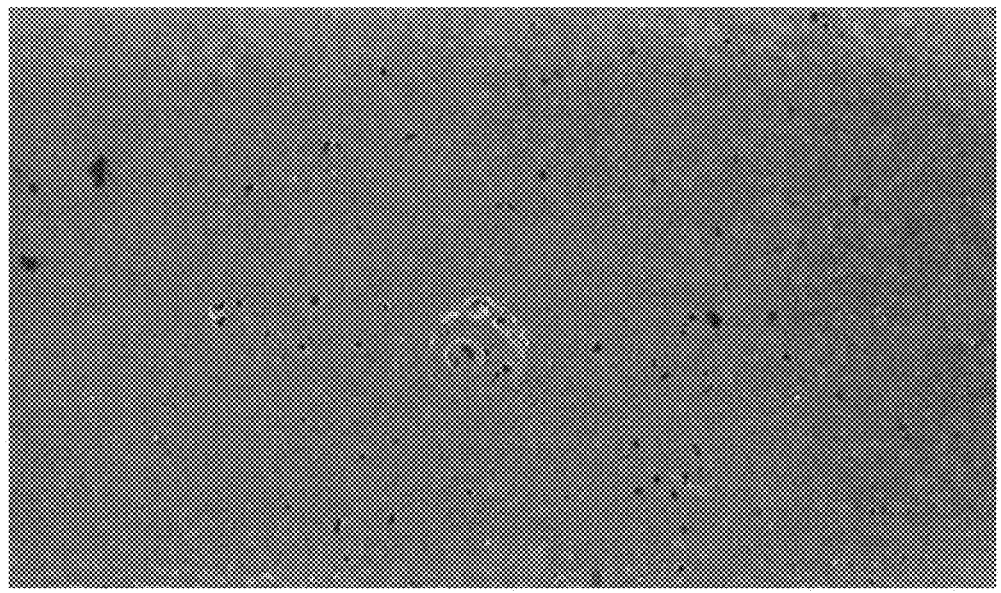
FIG. 6B is a photograph of appearance showing a part of an upper surface of a fluorescent member of a light emitting device using a fluorescent material of Example 4 after a durability test.
Figure 7A:
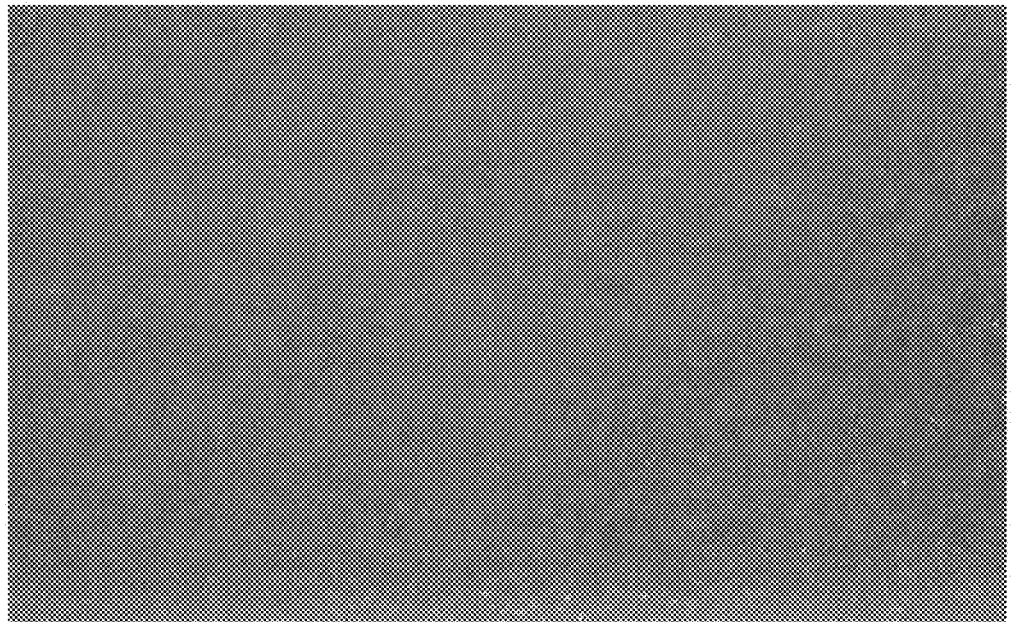
FIG. 7A is a photograph of appearance showing a part of an upper surface of a fluorescent member of a light emitting device using a fluorescent material of Comparative Example 1 before a durability test.
Figure 7B:
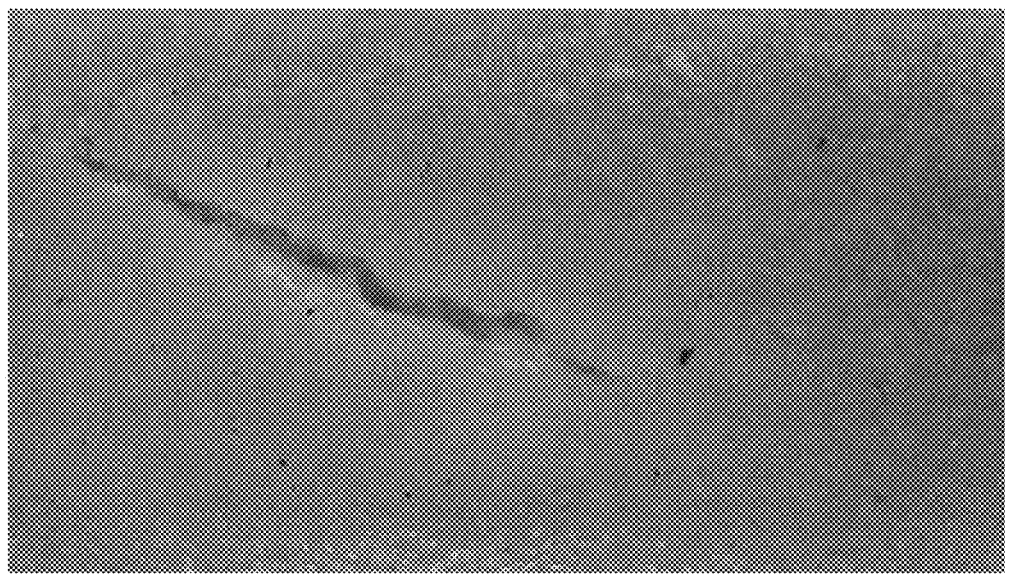
FIG. 7B is a photograph of appearance showing a part of an upper surface of a fluorescent member of a light emitting device using a fluorescent material of Comparative Example 1 after a durability test.

Before and after the durability test, photographs of exterior showing a part of an upper surface of the fluorescent member of the light emitting device using the fluorescent material of Example 4 and photographs of exterior showing a part of an upper surface of the fluorescent member of the light emitting device using the fluorescent material of Comparative Example 1 were obtained. FIG. 6A is a photograph of exterior showing a part of an upper surface of the fluorescent member of the light emitting device using the fluorescent material of Example 4 before the durability test, and FIG. 6B is a photograph of exterior showing a part of an upper surface of the fluorescent member of the light emitting device using the fluorescent material of Example 4 after the durability test. FIG. 7A is a photograph of exterior showing a part of an upper surface of the fluorescent member of the light emitting device using the fluorescent material of Comparative Example 1 before the durability test, and FIG. 7B is a photograph of exterior showing a part of an upper surface of the fluorescent member of the light emitting device using the fluorescent material of Comparative Example 1 after the durability test.

TABLE 1

| | Content of each element (% by mass) | | | Initial value Relative luminous flux Pi (%) | Durability evaluation at 85° C. and 250 mA for 700 hours | | Relative luminous flux Po (%) |
|---|---|---|---|---|---|---|---|
| | Al | Ca | Si | | $\Delta x$ | $\Delta y$ | |
| Comparative Example 1 | — | — | — | 100 | 0.05 | 0.08 | 47 |
| Example 1 | 0.2 | — | — | 100 | 0.01 | 0.01 | 79 |
| Example 2 | 0.6 | — | — | 93 | 0.01 | 0.01 | 82 |
| Example 3 | 1.0 | — | — | 86 | 0.01 | 0.01 | 77 |
| Example 4 | 0.2 | — | 1.7 | 98 | 0.01 | 0.01 | 87 |
| Example 5 | 0.6 | — | 2.1 | 99 | 0.01 | 0.01 | 82 |
| Example 6 | 0.9 | — | 2.2 | 97 | 0.00 | 0.02 | 80 |
| Example 7 | — | 2.4 | 2.3 | 94 | 0.01 | 0.00 | 71 |

As shown in Table 1, in all of Examples 1 to 7, though the relative luminous flux Pi of the initial value was equal to or slightly lower than that of Comparative Example 1, the relative luminous flux Po after elapsing for 700 hours was higher than that of Comparative Example 1; a lowering of the initial luminous flux could be suppressed; and excellent durability was revealed. In all of Examples 1 to 7, the Δx was 0.01 or less, and the Δy was 0.02 or less; changes in the x-value and the y-value in the chromaticity coordinate from the initial values were small; the chromaticity change was suppressed; and excellent durability was achieved.

In Comparative Example 1, the relative luminous flux Po after elapsing for 700 hours was lowered to 50% or less. In Comparative Example 1, changes in the x-value and the y-value in the chromaticity coordinate from the initial values were large.

As shown in Table 1, in comparison of the relative luminous flux Po of Examples 1 to 6 with the relative luminous flux Po of Example 7, the lowering of the relative luminous flux Po of Examples 1 to 6 is more suppressed than that of Example 7. This is because an activation energy for reacting with fluorine is controlled by a polarizability of a cation coupling with fluorine, and aluminum is smaller in the polarizability than calcium, and therefore, it may be considered that aluminum is smaller in the activation energy for reacting with fluorine and readily reacts with fluorine. That is, it may be considered that the aluminum hydroxide particle more likely reacts with fluorine than the calcium hydroxide particle and readily captures fluorine. It may be considered that a crystal structure of the aluminum hydroxide particle is more fragile than a crystal structure of the calcium hydroxide particle, and the aluminum hydroxide particle more likely reacts with fluorine than the calcium hydroxide particle and readily captures fluorine. From these reasons, the aluminum hydroxide particles more likely captures fluorine existing on the surface of the fluorescent material core or a gas containing fluorine slightly generated from the fluorescent material core than the calcium hydroxide particle, and therefore, it may be considered that the adhesiveness to the resin is improved, the initial luminous flux can be made high, and degradation of the resin is suppressed, whereby the lowering of the initial luminous flux is suppressed.

As shown in FIG. 2, in Example 3, in the infrared absorption spectrum as measured by FT-IR, peaks derived from aluminum hydroxide ($Al(OH)_3$) and/or aluminum hydroxide oxide ($AlO(OH)$) were confirmed in a wavenumber region of 3,000 $cm^{-1}$ or more and 3,600 $cm^{-1}$ or less. From this result, it may be considered that in the fluorescent material of Example 3, the aluminum hydroxide ($Al(OH)_3$) particle and/or the aluminum hydroxide oxide ($AlO(OH)$) particle is disposed on the surface of the fluorescent material core.

On the other hand, as shown in FIG. 2, in Comparative Example 1, in the infrared absorption spectrum as measured by FT-IR, peaks derived from aluminum hydroxide ($Al(OH)_3$) and/or aluminum hydroxide oxide ($AlO(OH)$) were not confirmed in a wavenumber region of 3,000 $cm^{-1}$ or more and 3,600 $cm^{-1}$ or less.

As shown in the SEM micrographs of FIGS. 3A and 3B, in Example 1, it can be confirmed that the aluminum hydroxide particle having a particle diameter smaller than the fluorescent material core is disposed on the surface of the fluorescent material core.

As shown in the SEM micrographs of FIGS. 4A and 4B, in Example 4, the quantity of the aluminum hydroxide particle adhered to the surface of the fluorescent material core is seen to be smaller than the quantity of the aluminum hydroxide particle adhered to the surface of the fluorescent material core of Example 1.

In Examples 1 and 4, the content (% by mass) of aluminum in the first fluorescent material is the same, and therefore, it may be considered that in Examples 1 and 4, the aluminum hydroxide particle in the quantity of the same degree is allowed to adhere to the surface of the fluorescent material core. As for the reason why the quantity of the aluminum hydroxide particle adhered to the surface of the fluorescent material core of Example 4 is seen to be smaller than the quantity of the aluminum hydroxide particle adhered to the surface of the fluorescent material core of Example 1, it may be considered that on the surface of the fluorescent material core of Example 4, the film-like material containing silicon dioxide and the aluminum hydroxide particle is formed, and the aluminum hydroxide particle is allowed to adhere to the surface of the fluorescent material core in a state of being embedded in this film-like material.

On the other hand, as shown in the SEM micrographs of FIGS. 5A and 5B, in Comparative Example 1, it could not be confirmed that a small particle is disposed on the surface of the fluorescent material core.

As shown in the photographs of exterior of FIGS. 6A and 6B, in a part of the upper surface of the fluorescent member of the light emitting device using the fluorescent material of Example 4, a large change was not seen in a part of the upper surface of the fluorescent member before the durability test and after the durability test for 700 hours, and a crack was not found even after the durability test. From the photograph of exterior after the durability test as shown in FIG. 6B, it could be confirmed that the light emitting device using the fluorescent material of Example 4 is excellent in the durability. In FIG. 6B, it is speculated that portions partly seen black are dusts adhered to the upper surface of the fluorescent member of the light emitting device during the durability test or at the time of photographing.

As shown in the photographs of exterior of FIGS. 7A and 7B, in a part of the upper surface of the fluorescent member of the light emitting device using the fluorescent material of Comparative Example 1, though a crack was not present before the durability test of FIG. 7A, a crack was generated after the durability test for 700 hours of FIG. 7B. It is speculated that the crack confirmed in a part of the upper surface of the fluorescent member of the light emitting device as shown in FIG. 7B was generated resulting from plural dissociations formed at an interface between the fluorescent material of Comparative Example 1 and the resin.

According to the method of the present disclosure, a fluorescent material with excellent durability can be obtained. The fluorescent material of the present disclosure can be used for a light emitting device. The light emitting device of the present disclosure has excellent durability and can be used in broad fields including displays, light sources for backlight, ordinary lighting systems, and in-vehicle lighting systems while using a light emitting diode as an excitation light source.

The claimed invention is:

1. A fluorescent material comprising a fluoride-containing fluorescent material core comprising Mn, at least one element selected from the group consisting of an alkali metal element and $NH_4^+$, and at least one element selected from the group consisting of a Group 4 element and a Group 14 element in a composition thereof; and at least one of an aluminum hydroxide particle and a calcium hydroxide particle as disposed on a surface of the fluorescent material core, wherein a sum total content of aluminum and calcium in the aluminum hydroxide particle and/or the calcium hydroxide particle disposed on the surface of the fluorescent material core is in a range of 0.1% by mass or more and 5.0% by mass or less based on 100% by mass of the fluorescent material.

2. The fluorescent material according to claim 1, wherein the fluorescent material core contains a fluoride having a composition represented by the following formula (1):

$$A_2[M_{1-p}Mn^{4+}_pF_6] \quad (1)$$

wherein A represents at least one element selected from the group consisting of an alkali metal element and $NH_4^+$; M represents at least one element selected from the group consisting of a Group 4 element and a Group 14 element; and p satisfies $0<p<0.1$.

3. The fluorescent material according to claim 2, wherein the composition of the fluoride represented by formula (1) contains potassium and silicon.

4. The fluorescent material according to claim 1, further comprising silicon dioxide disposed on the surface of the fluorescent material core.

5. The fluorescent material according to claim 4, wherein the content of silicon contained in silicon dioxide disposed on the surface of the fluorescent material core is in a range of 0.1% by mass or more and 10.0% by mass or less based on 100% by mass of the fluorescent material.

6. A light emitting device comprising a first fluorescent material containing the fluorescent material according to claim 1; and a light emitting element having a light emission peak wavelength in a wavelength range of 380 nm or more and 470 nm or less.

7. The light emitting device according to claim 6, further comprising a second fluorescent material having a light emission peak wavelength in a wavelength range of 500 nm or more and 580 nm or less.

8. A method of producing a fluorescent material comprising:

preparing a fluoride-containing fluorescent material core comprising Mn, at least one element selected from the group consisting of an alkali metal element and $NH_4^+$, and at least one element selected from the group consisting of a Group 4 element and a Group 14 element in a composition thereof;

allowing at least one of an aluminum hydroxide particle and a calcium hydroxide particle to adhere to the fluorescent material core in a dispersion containing the fluorescent material core dispersed in a liquid medium; and separating the fluorescent material containing at least one of the aluminum hydroxide particle and the calcium hydroxide particle adhered to the fluorescent material core from the liquid medium.

9. The method of producing a fluorescent material according to claim 8, further comprising adding a silicon compound and a basic solution to the dispersion, thereby allowing a film-like material containing at least one of the aluminum hydroxide particle and the calcium hydroxide particle and silicon dioxide to adhere to the fluorescent material core.

10. The method of producing a fluorescent material according to claim 9, wherein the basic solution is at least one selected from the group consisting of an ammonia aqueous solution, a sodium hydroxide aqueous solution, a potassium hydroxide aqueous solution, a sodium carbonate aqueous solution, and a potassium carbonate aqueous solution.

11. The method of producing a fluorescent material according to claim 8, further comprising adding an aluminum salt and a basic solution to the dispersion, thereby allowing the aluminum hydroxide particle to adhere to the fluorescent material core.

12. The method of producing a fluorescent material according to claim 11, wherein the aluminum salt is at least one selected from the group consisting of aluminum chloride, aluminum sulfate, and aluminum nitrate.

13. The method of producing a fluorescent material according to claim 11, wherein the basic solution is at least one selected from the group consisting of an ammonia aqueous solution, a sodium hydroxide aqueous solution, a potassium hydroxide aqueous solution, a sodium carbonate aqueous solution, and a potassium carbonate aqueous solution.

14. The method of producing a fluorescent material according to claim 8, comprising a step of adding a silicon compound, an aluminum salt, and a basic solution to the dispersion, thereby allowing the aluminum hydroxide particle and silicon dioxide to adhere to the fluorescent material core.

15. The method of producing a fluorescent material according to claim 14, wherein the aluminum salt is at least one selected from the group consisting of aluminum chloride, aluminum sulfate, and aluminum nitrate.

16. The method of producing a fluorescent material according to claim 14, wherein the basic solution is at least one selected from the group consisting of an ammonia aqueous solution, a sodium hydroxide aqueous solution, a potassium hydroxide aqueous solution, a sodium carbonate aqueous solution, and a potassium carbonate aqueous solution.

17. The fluorescent material according to claim 1, wherein the at least one of an aluminum hydroxide particle and a calcium hydroxide particle captures a gas containing fluorine generated from the fluoride-containing fluorescent material core.

* * * * *